United States Patent [19]

Doluca

[11] Patent Number: 4,639,715
[45] Date of Patent: Jan. 27, 1987

[54] FLASH ANALOG TO DIGITAL CONVERTER

[75] Inventor: Tunc Doluca, Santa Clara, Calif.

[73] Assignee: Intersil, Inc., Cupertino, Calif.

[21] Appl. No.: 579,276

[22] Filed: Feb. 13, 1984

[51] Int. Cl.⁴ ............................................ H03K 13/02
[52] U.S. Cl. .......................... 340/347 AD; 340/347 M; 320/1
[58] Field of Search ................... 340/347 AD, 347 M; 307/279, 355, 356, 360, 362, 530

[56] References Cited

U.S. PATENT DOCUMENTS

| | | | |
|---|---|---|---|
| 3,460,131 | 8/1969 | Gorbatenko et al. | 340/347 AD |
| 3,483,550 | 12/1969 | Max | 340/347 AD |
| 3,501,625 | 3/1970 | Gorbatenko | 340/347 AD X |
| 3,816,803 | 6/1974 | Gordon | 340/347 AD X |
| 3,859,654 | 1/1975 | Harrison et al. | 340/347 AD |
| 3,935,569 | 1/1976 | Marcel et al. | 340/347 AD |
| 3,967,269 | 6/1976 | Fletcher | 340/347 AD |
| 4,122,439 | 10/1978 | Ninomiya | 340/347 AD |
| 4,124,844 | 11/1978 | Black et al. | 340/347 AD |
| 4,131,885 | 12/1978 | Ninomiya | 340/347 AD |
| 4,156,233 | 5/1979 | Puckette et al. | 340/347 AD |
| 4,353,060 | 10/1982 | Endoh et al. | 340/347 AD |

Primary Examiner—William M. Shoop, Jr.
Assistant Examiner—Sharon D. Logan
Attorney, Agent, or Firm—Stanley C. Corwin; Mark Mollon

[57] ABSTRACT

An improved analog to digital converter is provided in which high and low order bytes of the digital output can be sequentially generated by a single flash converter circuit. Upon the generation of the high order byte, a high byte equivalent voltage is subtracted from the analog input voltage and the residual is multiplied by a predetermined factor. The resultant product signal is converted by the same flash converter circuit to the low order byte. In addition, the low scale and full scale of the converter inputs may be programmed to have the same polarity as, or the opposite polarity of, the polarities of the reference voltages.

3 Claims, 14 Drawing Figures

| CONDITION | STATUS BITS | | CONVERSION ARITHMETIC OPERATION ON COMPARATORS | SWITCH TO | | ARITHMETIC OPERATION ON SCA | SWITCH TO | |
|---|---|---|---|---|---|---|---|---|
| | POL | OPP | | SAMIH | SAMRH | | SCMI | SCMR |
| (FULL SCALE) $V_{IN} > 0$, $V_{RP} > 0$ | 1 | 0 | $CV_{IN} - V_{TAP}(n)$ | SAM | NSAM | $16 * [V_{IN} - V_{TAP}(n)]$ | NSCSM | SCSM |
| $V_{IN} > 0$, $V_{RP} < 0$ | 0 | 1 | $CV_{IN} + V_{TAP}(n)$ | SAM | SAM | $16 * [V_{IN} + V_{TAP}(n)]$ | NSCSM | NSCSM |
| $V_{IN} < 0$, $V_{RP} > 0$ | 1 | 0 | $-[CV_{IN} + V_{TAP}(n)]$ | NSAM | NSAM | $16 * [V_{IN} + V_{TAP}(n)]$ | NSCSM | NSCSM |
| $V_{IN} < 0$, $V_{RP} < 0$ | 0 | 0 | $-[CV_{IN} - V_{TAP}(n)]$ | NSAM | SAM | $16 * [V_{IN} + V_{TAP}(n)]$ | NSCSM | SCSM |

*Fig. 7.*

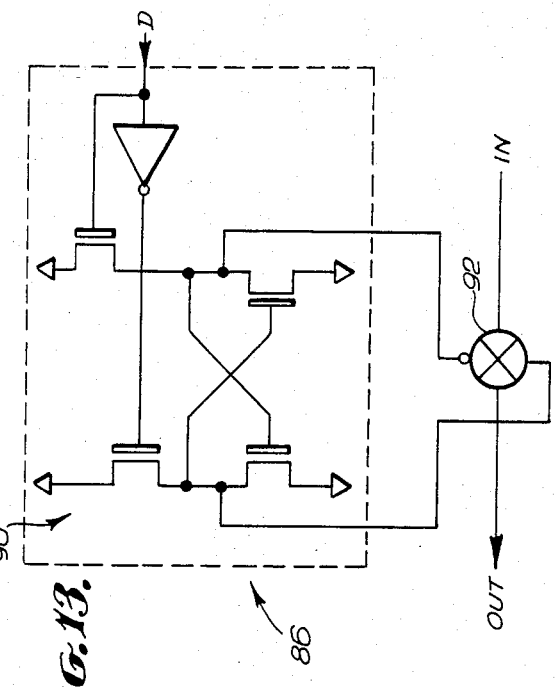

*Fig. 13.*

*Fig. 8.*

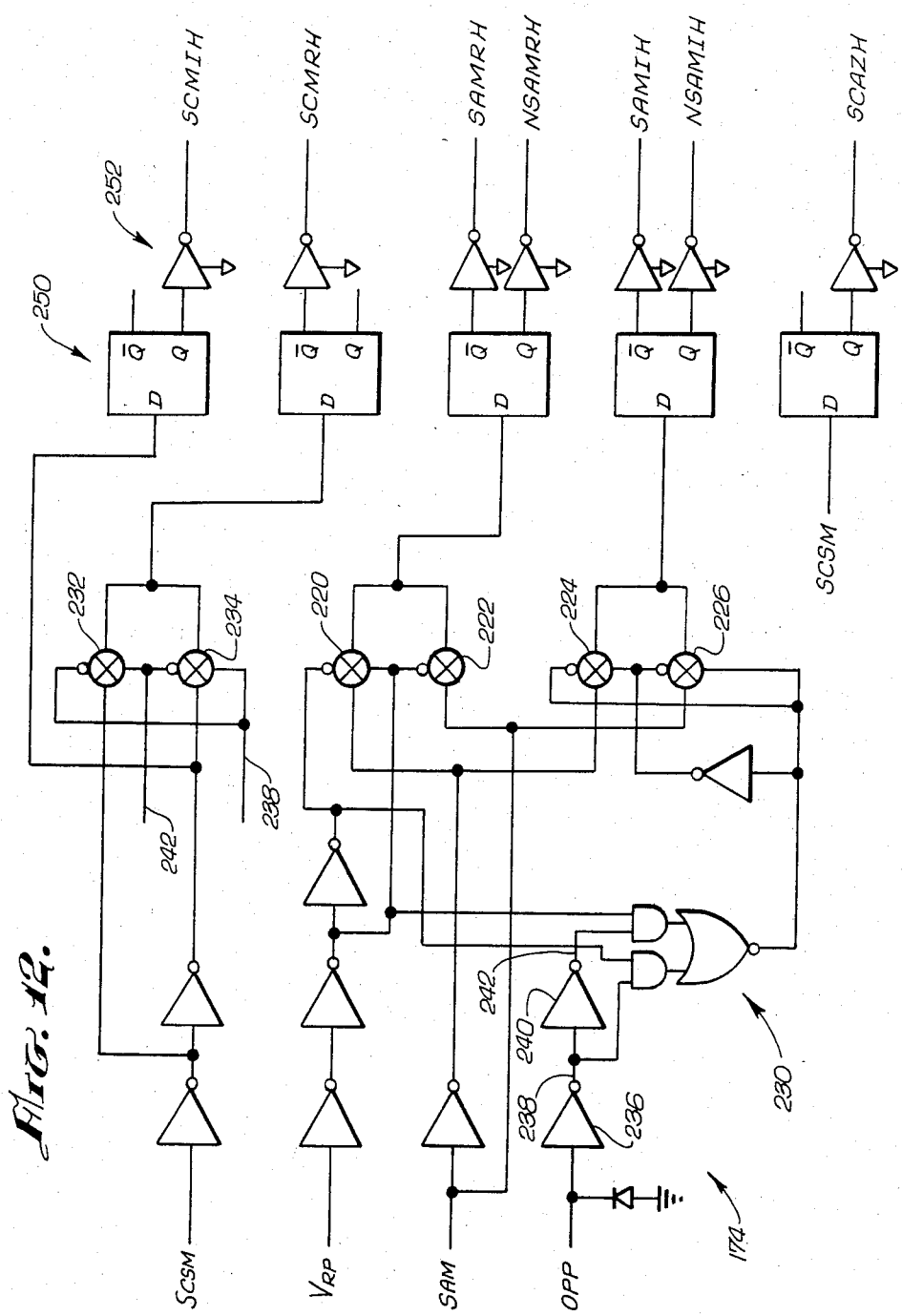

FLASH ANALOG TO DIGITAL CONVERTER

BACKGROUND OF THE INVENTION

1. Field of the Invention

The present invention relates to analog to digital converters.

2. Description of the Prior Art

An analog to digital converter is a circuit which converts an analog input signal to a digital representation, usually a binary number. The number of bits in the output of these circuits varies, with those circuits having the greatest number of output bits having the greatest potential accuracy.

One type of converter circuit, known as a flash converter, computes all the bits (or a group of bits) of the digital output in parallel such that the conversion is done very quickly. However, the circuitry for flash converters tends to grow very large for applications requiring a high resolution output. For example, a typical design for a flash converter having a two-bit ouput (FIG. 1) has four equal series-connected resistors and four comparators, with one input of each of the comparators connected to a corresponding resistor. A reference voltage applied across the resistors provides four distinct incremental reference voltages to the four comparators which compare these voltage levels to the analog input signal. Combinational logic converts the outputs of the comparators to a two-bit digital representation of the analog input signal.

In general, the number of comparators utilized in a flash converter increases by a factor of two for each additional bit of the output. Thus, a three-bit flash converter typically has eight comparators and a four bit flash converter has sixteen comparators. Accordingly, it is readily seen that for high accuracy applications requiring a large number of output bits, a flash converter can grow unrealizably large and complicated.

In order to reduce the complexity of the circuits, some converter circuits have utilized sequentially operated flash converter circuits. An example of such a circuit is the National Semiconductor ADC0820 8-bit high speed microprocessor compatible analog to digital (A/D) converter circuit (FIG. 2). This circuit converts a voltage input signal to an 8-bit digital representation, four bits at a time using a "half-flash" technique. The circuit has two 4-bit flash converter circuits, one of which computes the four most significant bits first The analog value of the four most significant bits is subtracted from the analog input signal to produce an analog difference or residual signal. After the subtraction, a second 4-bit flash converter computes the four least significant bits from the analog residual signal.

Each flash converter of the National Semiconductor circuit is believed to have 16 comparators for a total of 32 comparators. This is a significant savings as compared to the 256 comparators which would be required in a straightforward flash converter. However, even circuit designs such as that utilized in the National Semiconductor circuit can grow quite large if a higher resolution output is desired. For example, a 10-bit output could double the required number of comparators to 64 comparators. Accordingly, a converter circuit which has a high resolution output yet is relatively uncomplicated is needed.

Another disadvantage with previous converter circuits is that the polarity of one of the reference voltages to the circuit usually determines the polarity of the full scale input. The full scale input is defined as the magnitude and polarity of the analog input signal which produces a full scale binary output (usually all one's) of the converter circuit. For example, if the input signal ranges from a minimum of 0 volts to a maximum of positive 5 volts, a positive 5 volt reference must be used for many prior art circuits to define the full scale input as a positive 5 volts. Alternatively, a negative 5 volt full scale input often requires a negative reference voltage. In the same manner, a second reference voltage input typically defines the polarity of the low scale input which produces the minimum or low scale binary output (usually all zero's).

Accordingly, in order to properly define the input range of the converter, it is usually necessary to have one or more reference voltages of particular polarities available as inputs to the converter circuit. In many systems, the appropriate polarity reference voltage is not always readily available. Providing additional required reference voltage polarities can increase the cost and complexity of a particular system.

SUMMARY OF THE INVENTION

It is an object of the present invention to provide an improved high resolution, analog to digital converter which is both fast and relatively uncomplicated It is a further object of the present invention to provide an improved analog to digital converter in which the polarity of the input range is selectable independent of the polarities of the reference inputs.

These and other objects and advantages are achieved in an improved analog to digital converter circuit which uses the same flash converter circuit to generate both the high order and low order bits of the digital output. After the high order bits are generated by the flash converter circuit, an equivalent analog voltage of the high order bits is subtracted from the analog input signal to produce a residual signal. This residual signal is multiplied by a factor corresponding to the number of bit positions of the high order bits to produce a product signal. The product signal is reapplied to the flash converter circuit which then generates the low order bits. Because the same flash converter circuit is used to generate both the high and low order bits, a significant reduction in the size of an analog to digital converter circuit can be achieved.

In another aspect of the present invention, the polarities of the full scale input and the low scale input are programmable to be the same as or the opposite of the reference inputs. In the illustrated emobodiment, the converter circuit includes a switched input comparator array in which the order in which a reference signal and an input signal are inputed by the array is a function of the polarity of one of the reference inputs, and the correspondence between the reference input polarity and the desired input range polarities. Changing the input order of the input signal and the reference signal allows the polarity of the full scale analog input signal (and the low scale input signal) to be set independently of the polarity of the reference inputs. Consequently, the converter circuit does not require particular reference input polarities in order to achieve the desired input range polarities.

BRIEF DESCRIPTION OF THE DRAWINGS

FIG. 7 is a table which indicates the derivation of various timing control signals as a function of the polarity of a reference voltage input and the polarity of the desired full scale analog input voltage;

FIG. 8 is a diagram representing the basic timing control signals SAM and SCSM;

FIG. 12 is a schematic diagram of the sampling control logic of the control logic of FIG. 9;

FIG. 13 is a schematic diagram of a latching switch of the comparator array of FIG. 4.

DETAILED DESCRIPTION OF THE DRAWINGS

Figure 1:
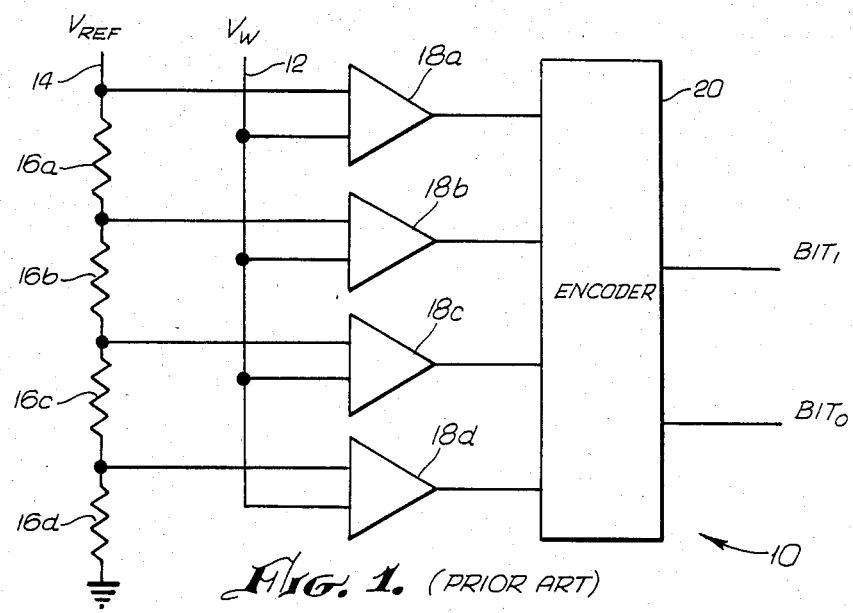
FIG. 1 is a schematic block diagram of a prior art analog to digital flash converter circuit.

FIG. 1 shows a prior art analog-to-digital flash converter circuit which is indicated generally at 10. The flash converter circuit 10 (hereinafter flash converter 10) has a first input 12 for an analog input voltage signal $V_{IN}$. A reference voltage $V_{REF}$ is inputted at a second input 14. The reference voltage $V_{REF}$ is applied to four equal series-connected resistors 16a–16d to produce four incremental reference voltages ranging from one-fourth $V_{REF}$ to $V_{REF}$.

The flash converter 10 further has four comparators 18a–18d, each of which has an input connected to an end of each of the four series-connected resistors 16a–16d, and a second input which is connected to the analog voltage input 12. Each comparator compares the analog input voltage $V_{IN}$ to one of the four incremental reference voltages, and produces a high or a low output in accordance with that comparison. In this manner, the comparators determine whether the analog input signal $V_{IN}$ is between ground and one-fourth $V_{REF}$, between one-fourth $V_{REF}$ and one-half $V_{REF}$, etc. An encoder circuit 20 generates a two-bit digital output, designated $Bit_1$ and $Bit_0$, from the outputs of the comparators 18a–18d. For example, if the analog input voltage $V_{IN}$ is less than one-fourth $V_{REF}$, the encoder circuit 20 outputs a $00_2$. The $00_2$ output of the encoder 20 is referred to as the zero or low scale output. If the analog input signal $V_{IN}$ is greater than $\frac{3}{4} V_{REF}$, the encoder circuit 20 outputs a $11_2$, the full scale output. Input voltages between these two extremes produce either a $01_2$ or $10_2$ output, depending upon the results of the comparison by the comparators 18a–18d.

As previously mentioned, the number of comparators and associated resistors of such a conventional prior art flash converter grows exponentially as the number of bits in the output increases. As seen above, the two-bit flash converter of FIG. 1 has four comparators and associated resistors. A three-bit flash converter typically eight comparators and resistors, a four-bit flash converter has 16 comparators and resistors, etc.

Figure 2:
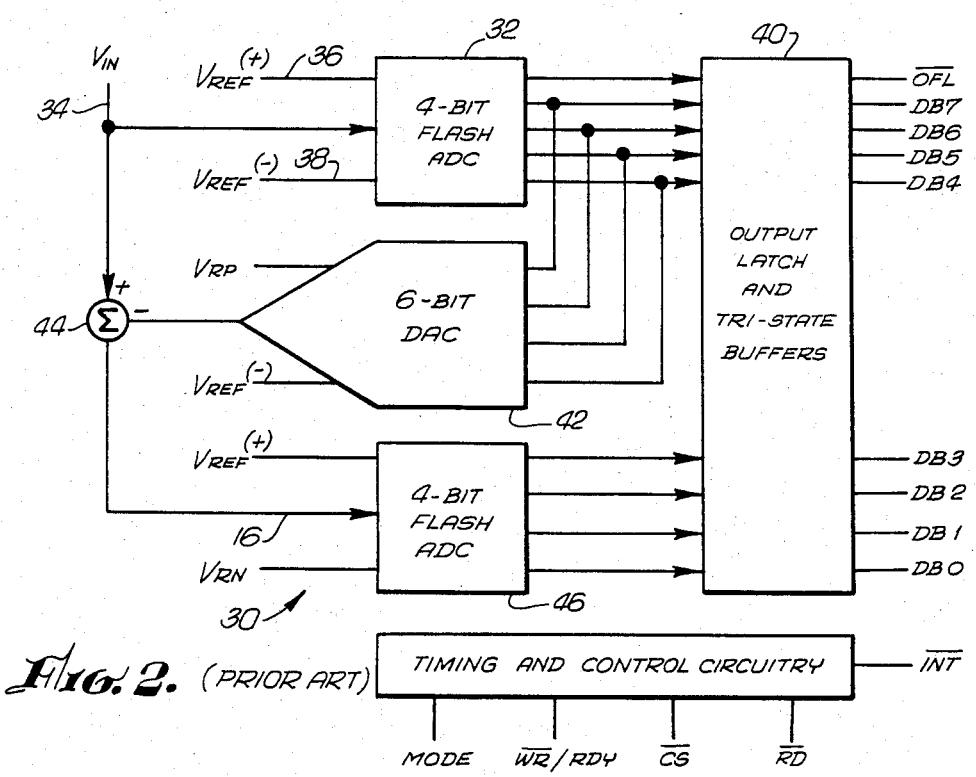
FIG. 2 is a schematic block diagram of another prior art analog to digital flash converter which utilizes a half flash technique.

In order to reduce the required number of resistors and comparators, some converters have utilized a "half-flash" technique in which half the bits (the high order bits) are generated by a first flash converter circuit and the other half (the low order bits) are subsequently generated by a second flash converter circuit. An example of such a converter circuit is indicated generally at 30 in FIG. 2. FIG. 2 is a schematic diagram of the National Semiconductor ADC0820 8-bit flash converter. The flash converter 30 includes a first four-bit flash analog to digital converter circuit 32 which is believed to be similar in design to the two-bit flash converter 10 of FIG. 1 except as a four-bit converter, the converter circuit 32 has 16 comparators rather than the four comparators shown in FIG. 1.

The converter circuit 30 has an input 34 for the analog input voltage $V_{IN}$ which is inputted by the four-bit flash converter 32. The flash converter 32 also has two inputs, 36 and 38 for the reference voltages $V_{REF}(+)$ and $V_{REF}(-)$, respectively. The flash converter circuit 32 compares the analog input voltage $V_{IN}$ to 16 incremental reference voltages and produces a four-bit digital output which is latched by an output latch and tri-state buffer circuit 40. The four bits generated by the four-bit flash converter circuit 32 are the four most significant bits of the 8-bit output of the converter 30.

A four-bit digital to analog converter circuit 42 converts the four bit output of the flash converter 32 to an analog signal which is subtracted from the analog input signal $V_{IN}$ by a summing circuit 44. The "residual" signal produced by the summing circuit 44 is inputted by a second four-bit flash analog to digital converter circuit 46 which produces a second four-bit digital output. These four bits are latched by the output latch 40 and are the four least significant bits of the 8-bit digital output.

The converter circuit 30 is somewhat slower than a conventional flash converter since the low order bits are not computed at the same time as the high order bits. However, the flash converter circuits 32 and 46 of the converter 30 may require as few as 32 comparators for an 8-bit digital output wherein a more conventional 8-bit flash converter could require as many as 256 comparators. Even so, it is seen that a higher resolution circuit following the design of the converter 30 of FIG. 2 would require a very large number of comparators. For example, a 10-bit converter could require as many as 64 comparators.

Still another disadvantage of the converter circuit 30 shown in FIG. 2 is that the circuit requires a positive reference voltage and the full scale output always corresponds to a positive voltage input signal. For example, a positive 5-volt reference voltage provided at the $V_{REF}(+)$ input 36 determines that a positive 5-volt input signal will produce the full scale output.

Other flash analog to digital converter circuits such as the Intersil 7115 integrated circuit chip have the capability of defining the polarity of the full scale input by the polarity of one of the reference voltage inputs. For example, a positive five volt reference voltage at the $V_{REF}(+)$ input determines that a negative five volt input signal will produce the full scale output; however, a negative 5-volt input at the $V_{REF}(+)$ input causes a positive 5-volt input to produce the full scale output.

Thus, a positive polarity full scale input requires a negative reference input.

Figure 3:
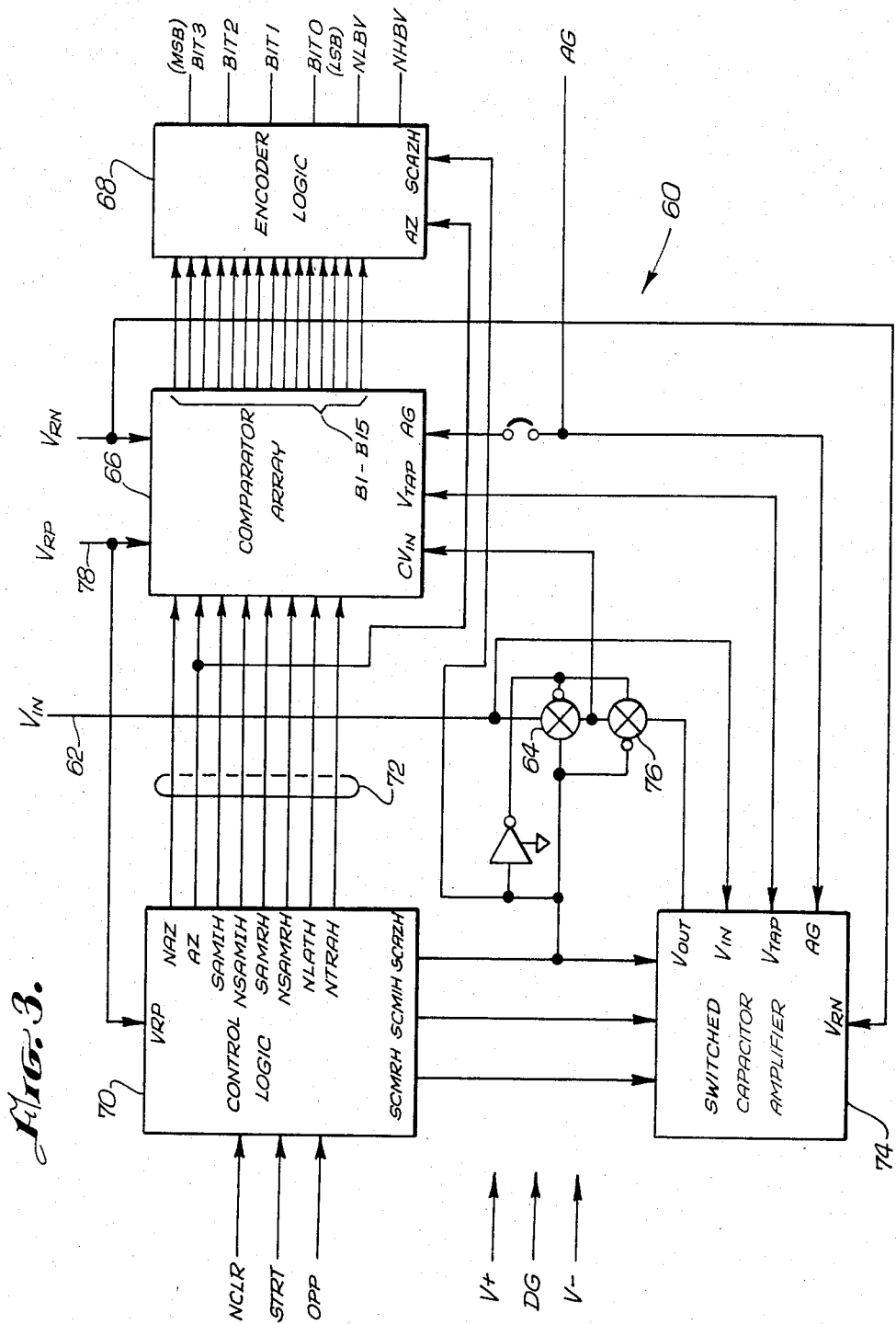
FIG. 3 is a schematic block diagram of an analog to digital converter circuit in accordance with the present invention.

Referring now to FIG. 3, a flash analog to digital converter circuit in accordance with a preferred embodiment of the present invention is indicated generally at 60. The converter 60 has an input 62 for the analog input signal $V_{IN}$. The input 62 is coupled by a switch 64 to the input designated $CV_{IN}$ of a comparator array 66. The comparator array 66 compares the analog input voltage $V_{IN}$ to 15 incremental reference voltages and activates one of 15 outputs B(1)–B(15) in accordance with that comparison. An encoder logic 68 has a four-bit output designated BIT0–BIT3 and outputs one of sixteen binary numbers in accordance with the activated output line B1–B15 of the comparator array 66.

The operation of the comparator array 66 and the other circuits of the converter 60 is controlled by a control logic circuit 70. The control logic 70 outputs eight timing control signals indicated at 72 to the comparator array 66. The control logic 70 also controls the opening and closing of the switch 64 which couples the analog input signal $V_{IN}$ to the input of the comparator array 66.

In the illustrated embodiment, the converter 60 converts the analog input signal $V_{IN}$ into an 8-bit digital representation in two steps. In the first step, the four most significant bits are outputed at the outputs BIT3–BIT0 of the encoder logic 68. An output line designated NHBV is activated to indicate to external circuitry that the four most significant bits are available. The four least significant bits are then computed in the second step. The encoder logic output line designated NLBV is activated when the output lines BIT3–BIT0 contain the four least significant bits.

As will be explained more clearly below, the single comparator array 66 and encoder logic 68 are used to compute both the high order bits and the low order bits of the digital representation of the analog input signal $V_{IN}$. This results in a significant savings in the required number of comparators over that required in many flash converters of the prior art of equal resolution.

During the first step in which the high order bits are computed, the switch 64 is closed by the control logic 70 thereby coupling the analog input signal $V_{IN}$ to the $CV_{IN}$ input of the comparator array 66. The comparator array 66 compares $V_{IN}$ to the 15 incremental reference voltages, and the encoder logic 68 coupled to the outputs of the array 66, outputs the corresponding four most significant bits at the outputs BIT3–BIT0. After the computation of the four most significant bits (also referred to as the "high byte"), the comparator array 66 outputs an analog voltage which is equivalent to the computed high byte, to a switched capacitor amplifier 74. This high byte equivalent voltage is designated "$V_{TAP}$".

The switched capacitor amplifier in the second step, subtracts the high byte equivalent voltage $V_{TAP}$ from the analog input signal $V_{IN}$ to produce a residual signal. The residual signal is multiplied by the switched capacitor amplifier by a factor of 16 to produce a product signal designated $V_{OUT}$. The product signal $V_{OUT}$ is coupled by a switch 76 back to the input $CV_{IN}$ of the comparator array 66. During the second step, the control logic 70 has opened the switch 64 (uncoupling the analog input signal $V_{IN}$) and has closed the switch 76 which couples the product signal $V_{OUT}$ to the input $CV_{IN}$ of the comparator array 66. The comparator array 66 then compares the product signal $V_{OUT}$ to the 15 incremental reference voltages causing the encoder logic 68 to output a four-bit digital representation which is the low byte or the four least significant bits.

The multiplication factor of the switched capacitor amplifier 74 is a function of the number of bits in the byte computed in each step. As seen above, the switched capacitor amplifier 74 of the illustrated embodiment multiplies the residual signal by a factor of 16 where each byte has four bit positions. In general, the multiplication factor is $2^n$ where n is the number of bits computed in each step. Thus, in a converter having a 10 bit output wherein the output is computed five bits at a time, a multiplication factor of 32 would be appropriate.

The converter 60 has a first reference voltage input 78 designated $V_{RP}$. The magnitude of the reference voltage applied to the input $V_{RP}$ determines the magnitude of the analog input signal corresponding to the full scale (all 1's) output of the converter 60. Similarly, a second reference voltage input designated $V_{RN}$ determines the magnitude of the analog input signal which corresponds to the low scale or zero output (all 0's) of the converter 60. Although the magnitudes of the analog input signals corresponding to the full scale and low scale outputs of the converter 60 are determined by the magnitudes of the reference voltages $V_{RP}$ and $V_{RN}$, respectively, the polarities of the full scale and low scale outputs are not. In accordance with the present invention, the control logic 70 of the converter 60 has a program input designated OPP. The OPP input of the converter 60 determines whether the full scale input signal has the same polarity as, or the opposite polarity of, the reference voltage $V_{RP}$. For example, a reference voltage of positive 5 volts applied to the $V_{RP}$ input of the converter 60 can result in the full scale output corresponding to an analog input signal of either 5 volts or negative 5 volts depending upon the value of the OPP input. Thus, the need for a negative reference voltage for a negative full scale input has been eliminated. The OPP input determines the correspondence between the polarity of the low scale input and the polarity of the second reference voltage input $V_{RN}$ in the same manner.

Figure 4:
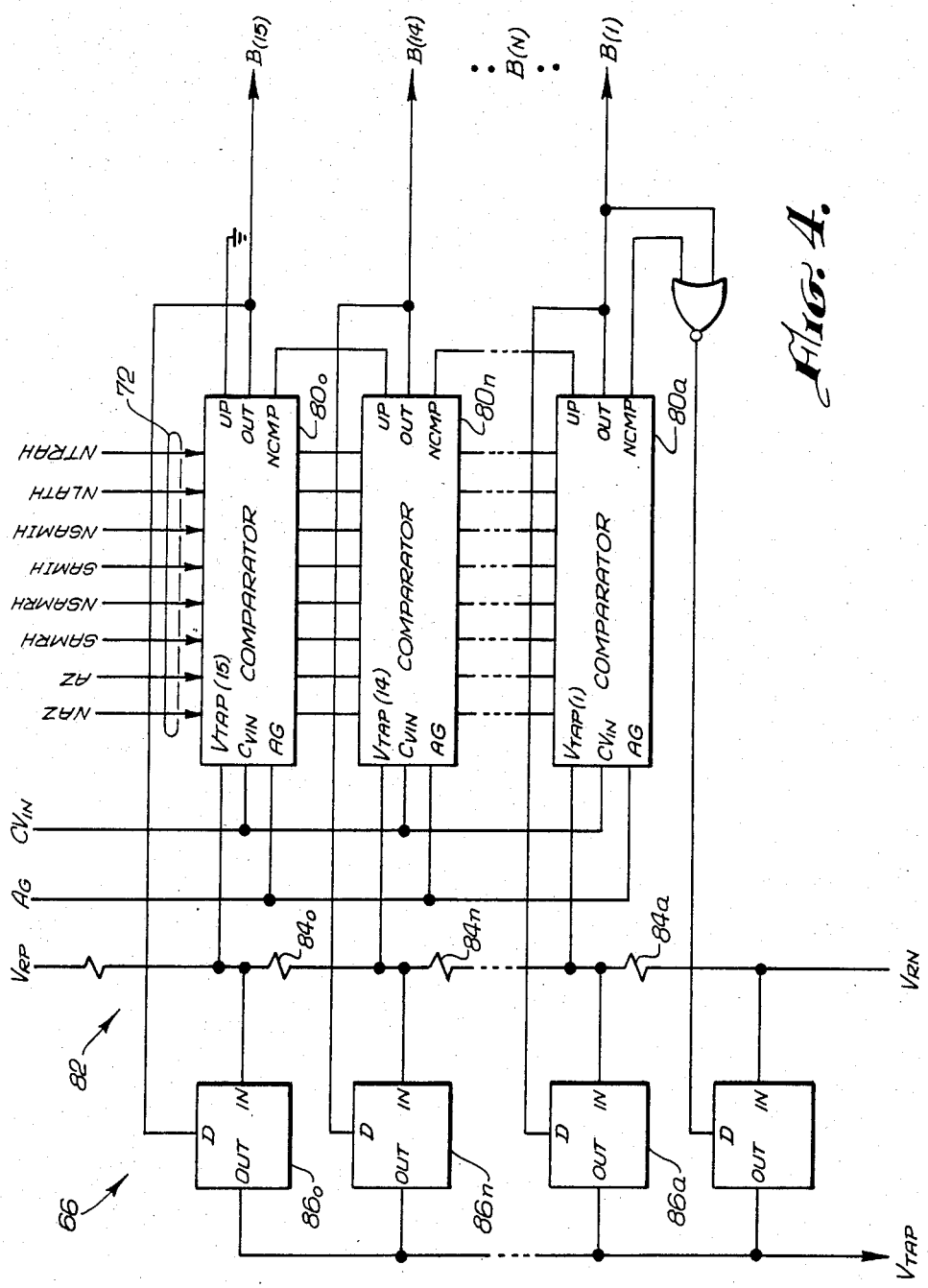
FIG. 4 is a schematic block diagram of the comparator array circuit of the converter circut of FIG. 3.

FIG. 4 shows a more detailed schematic block diagram of the comparator array 66 of FIG. 3. As shown therein, the comparator array 66 has 15 comparators 80a–80o in the illustrated embodiment. A resistor ladder 82 includes 16 series-connected resistors 84a–84p which are connected between the two reference voltages -$V_{RP}$ and $V_{RN}$. It is seen that the resistors 84a–84$_p$ divide the voltage differential between $V_{RP}$ and $V_{RN}$ into 16 incremental voltages. The first 15 such voltages are designated $V_{TAP}(1)$ –$V_{TAP}(15)$.

Each comparator 80a–80o has an input connected to the comparator array input $CV_{IN}$ and a second input $V_{TAP}(N)$ connected to the upper end of an associated resistor 84a–84o. The comparators of the comparator array 66 compare the input voltage $CV_{IN}$ to each of the 15 incremental reference voltages $V_{TAP}(1)$ –$V_{TAP}(15)$, and each comparator outputs a logical one at the output NCMP if the input voltage exceeds the incremental reference voltage associated with that particular comparator. If the comparator outputs a logical one at the NCMP output, the comparator also outputs a logical one output at the associated output B(N) of the B(1)–B(15) unless inhibited by the comparator above in the array. A logic one state of the NCMP output of a comparator blocks the B(N) output of the next comparator below in the array. Thus, only the comparator associated with the highest incremental reference voltage which does not exceed the input voltage outputs a logical one at its B(N) output. All other comparators below that comparator are inhibited by the comparator immediately above in the array.

Associated with each comparator 80a–80o is a latching switch 86a–86o. Each latching switch 86a–86o couples the high end of an associated resistor 84a–84o to the output $V_{TAP}$ of the comparator array 66. The outputs B(1)–B(15) of the comparators 80a–80o are connected to the latch input "D" of the associated latching switch 86a–86o. The comparator which produces the logic high output on one of the outputs B(1)–B(15) also latches the associated latching switch in the closed position. The closed switch couples the high end of the associated resistor of the resistor ladder 82 to the output $V_{TAP}$ so that the incremental reference voltage $V_{TAP}(N)$ associated with the activated output line B(1)–B(15) is output at the $V_{TAP}$ output of the array 66. Since the encoder logic 68 (FIG. 3) encodes the activated output line B(1)–B(15) into one of 16 binary numbers at the BIT3–BIT0 output (representing the high byte of the 8-bit digital output), the incremental reference voltage $V_{TAP}(N)$ at the $V_{TAP}$ output is the high byte equivalent analog voltage.

As shown in FIG. 13, each latching switch 86 includes a D-type flip flop 90 and a switch 92. The control inputs of the switch 92 are coupled to the Q and $\overline{Q}$ output of the flip flop 90 such that a latch signal applied to the D input of the flip flop 90 latches the switch 92 in either the open or closed position depending upon the state of the latch signal.

Figure 5:
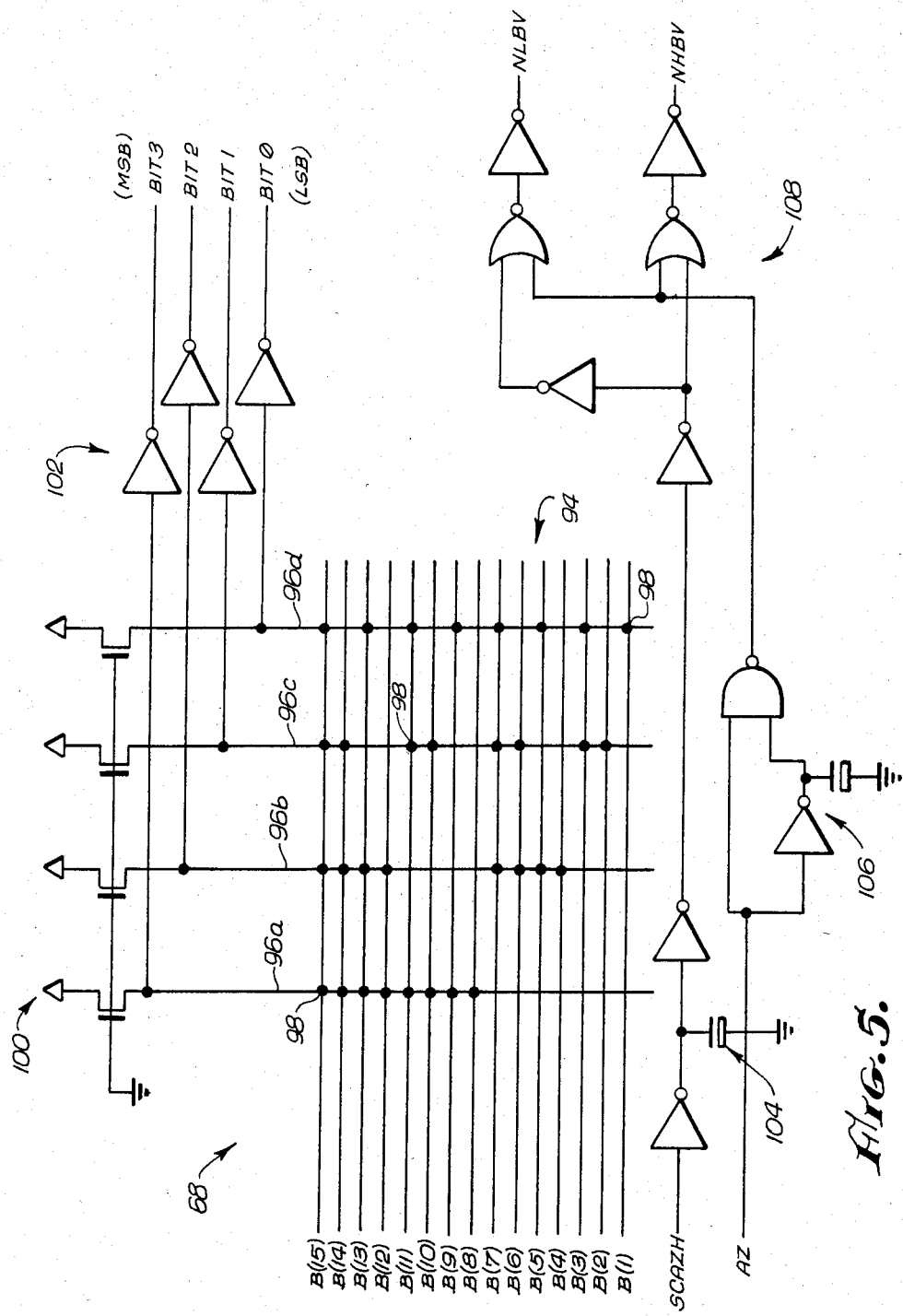
FIG. 5 is a schematic diagram of the encoder circuit of the converter circuit of FIG. 3.

The encoder logic 68 is shown in greater detail in FIG. 5. The encoder logic 68 includes a programmed logic array 94 in which four column lines 96a–96d are selectively coupled by transistor links to the input lines B(1)–B(15) from the comparator array 66 (FIG. 4). Each linking transistor is represented by a dot 98 at the intersection of an output line 96a–96d with the input lines B(1)–B(15). Each output line 96a–96d is coupled to one of four pull up transistors 100 and to one of the encoder logic outputs BIT3–BIT0 by an associated inverter 102. As shown in FIG. 5, input line B(1) is coupled by a linking transistor 98 to only output line 96d. Consequently, when input line B(1) is activated (logic high), encoder output line BIT0 is a logic one while output lines BITL–BIT3 remain logic zero producing a $1_2$ output of the converter 60. The remaining input lines B2–B15 are coupled to the output lines 96a–96d so that activation of one of the input lines B(2)–B(15) produces a corresponding binary output $2_2$–$15_2$. If none of the input lines B(1)–B(15) are activated, the encoder outputs bit 0-bit 3 all remain logic 0 corresponding to a $0_2$ output.

As previously mentioned, the converter 60 computes the four most significant bits in a first step and then computes the four least significant bits in a second step. The encoder logic 68 includes a first one-shot circuit 104 coupled to the timing control signal line SCAZH and a second one shot circuit 106 coupled to the timing control signal line AZ. The control signals AZ and SCAZH are generated by the control logic 70 and control the auto-zeroing of the comparators 80a–80o and the switched capacitor amplifier 74.

Figure 10:
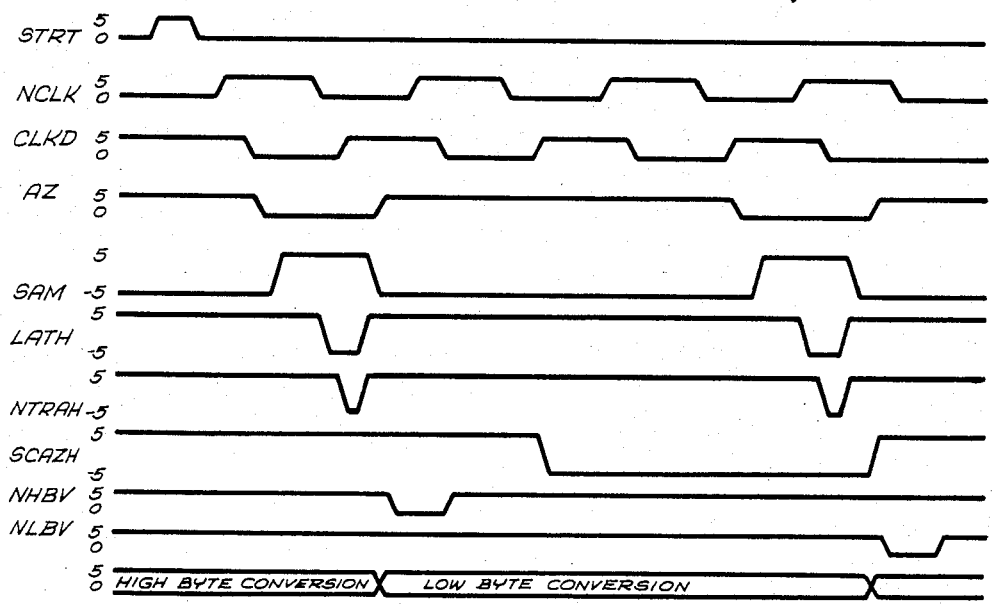
FIG. 10 is a timing diagram of various control and timing signals of the converter circuit of FIG. 3.

The outputs of the two one-shot circuits 104 and 106 are coupled by a combinational logic circuit 108 to a first output line NHBV (high byte valid) and a second output line NLBV (low byte valid). The states of these output signals are a function of the control logic 70 timing control signals SCAZH and AZ and as their name suggests, indicate when the bits appearing at the encoder output BIT3–BIT0 are the high byte or the low byte, respectively. Referring to FIG. 10, the high byte valid (NHBV) signal is active after the AZ (auto zero) signal returns to the active state. As discussed below, the comparator array 66 conducts the comparison of the input signal with the incremental reference voltages while the AZ signal is inactive. Thus, as shown in FIG. 10, the high byte conversion is complete when the AZ signal returns to the active state indicating the resumption of the auto zero phase of the comparators.

Figure 6:
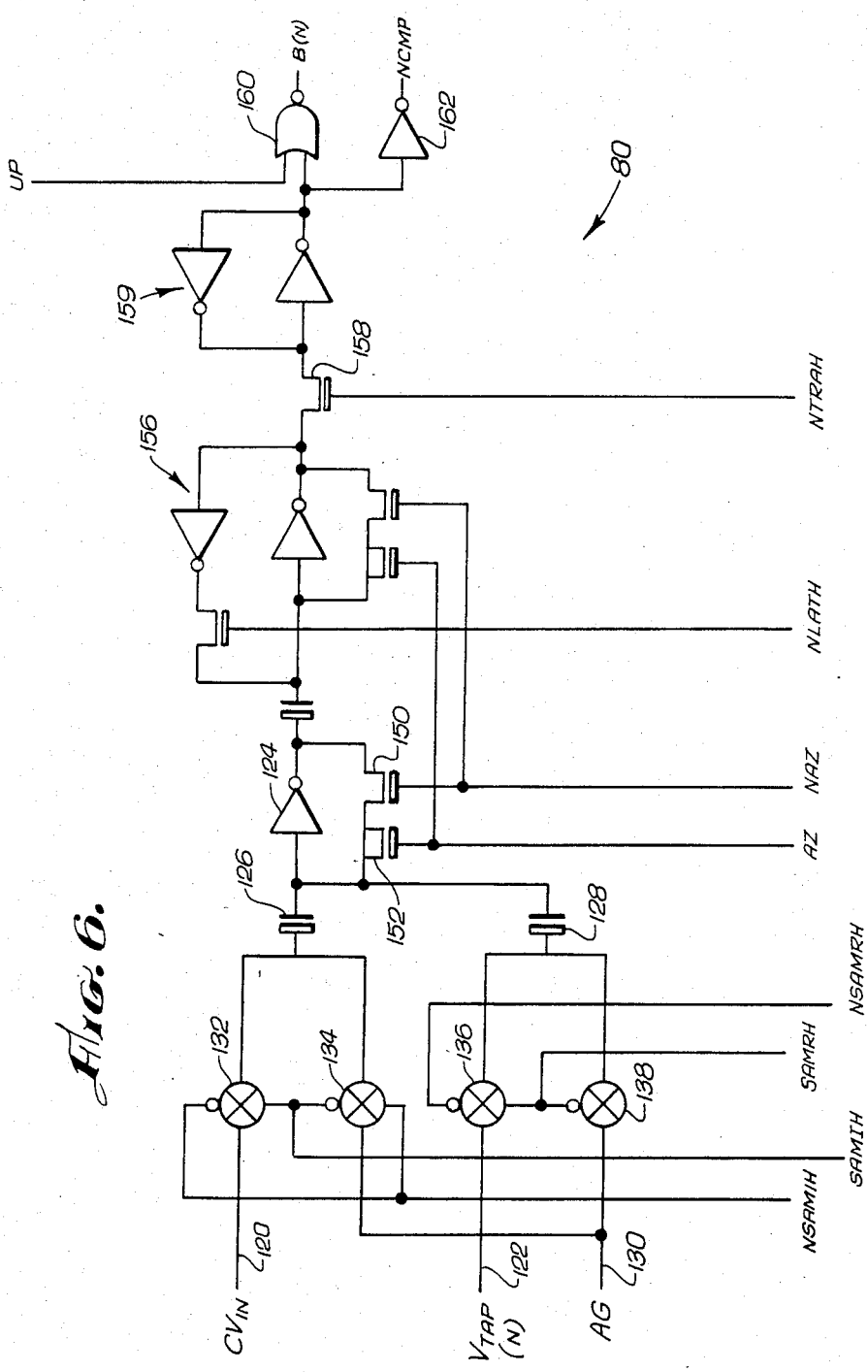
FIG. 6 is a detailed schematic diagram of a comparator circuit of the comparator array of FIG. 4.

FIG. 6 shows a schematic diagram of a comparator circuit 80 which is representative of each of the comparators 80a–80o of FIG. 4. The comparator 80 compares the analog input voltage $CV_{IN}$ at an input 120 to the associated incremental reference voltage $V_{TAP}(N)$ at a second input 122. The incremental reference voltage $V_{TAP}(N)$ represents one of the incremental reference voltages $V_{TAP}(1)$–TAP(15) of FIG. 4. Unless disabled by the next higher comparator in the comparator array 66, the comparator array will output a logic one at the output designated B(N) if the absolute value of the analog input signal $C_{VIN}$ is greater than the absolute value of the incremental reference voltage $V_{TAP}(N)$.

The comparator 80 includes an inverting amplifier 124 and a pair of input capacitors 126 and 128. The first input capacitor 126 is coupled to either the analog input signal $CV_{IN}$ or analog ground from an input 130, by the switches 132 and 134, respectively. Similarly, the second capacitor 128 is coupled to either the incremental reference voltage $V_{TAP}(N)$ or analog ground by the switches 136 and 138, respectively. In the illustrated embodiment of the present invention, the order in which the voltages CVIN and $V_{TAP}(N)$ are coupled by the switches to their respective input capacitors depends upon the respective polarities of the reference voltage input $V_{RP}$ and the desired full scale input. As previously mentioned, the polarity of the full scale input is not limited to the polarity of the reference voltage inputs in a converter circuit in accordance with the present invention. The polarity of the full scale input may be defined to be the same as or the opposite of the polarity of the reference voltage input $V_{RP}$. The correspondence between the polarity of this reference voltage input and the desired polarity of the full scale input is defined by the program input OPP of the control logic 70 of FIG. 3. If the full scale input is to have the same polarity as the reference input voltage $V_{RP}$, a logic zero is inputted into the control logic program input OPP. Alternatively, if the polarities of the full scale input and the reference voltage $V_{RP}$ are opposite, a logic one is inputted into the OPP input.

It should be recognized that the input OPP also determines the relative polarities of the low scale input and the reference input voltage $V_{RN}$. However, the operation of the OPP input will be described with respect to the full scale input only for clarity.

The order in which the input voltages $CV_{IN}$ and $V_{TAP}(N)$ are coupled by the switches to the input capacitors is a function not only of the relative polarities of the full scale input and the reference voltage $V_{RP}$ but also of the polarity of the reference voltage $V_{RP}$ itself. The table of FIG. 7 summarizes the four possible permutations of the polarities of the full scale input of $V_{IN}$ and the reference voltage $V_{RP}$. The first possibility is where the full scale input and the reference voltage $V_{RP}$ are both positive (greater than zero). Since the reference voltage is positive, the reference voltage polarity status bit POL is assigned a logic one value. In that the polarities of these two voltages are the same (both positive), the OPP program input is assigned a logic zero. The remaining possibilities are set forth in FIG. 7.

Referring back to FIG. 6, the timing control signals which open and close the input signal switches 132 and 134 are designated SAMIH and NSAMIH. The reference voltage switches 136 and 138, on the other hand, are controlled by the timing control signals SAMRH and NSAMRH. The letter H designation of each of these signals does not refer to a logic level state but instead indicates that these are high voltage signals ranging from, for example, minus five volts to positive five volts rather than zero to plus five volts. The prefix "N" indicates that the signal is the logical inverse of a correspondingly designated signal.

These timing control signals are generated by the control logic 70 (FIG. 3). They are derived from a basic timing control signal SAM (FIG. 8) (short for "sample") and the phase of these signals relative to the basic timing signal SAM is a function of the program input OPP and the polarity (POL) of the reference voltage input $V_{RP}$. As shown in the table of FIG. 7, when both the full scale input of $V_{IN}$ and the reference voltage $V_{RP}$ are both positive, the control signal SAMIH for the input switches 132 and 134 is basically the timing signal SAM unchanged. In addition, the timing signal SAMRH for the reference voltage input switches 136 and 138 is the logical inverse designated NSAM.

As shown in FIG. 8, the basic timing signal SAM defines two periods. The first period, designated "AZ" is the auto-zero period in which the output of the amplifier 124 (FIG. 6) is shorted to its input. Coupling the output of the amplifier 124 to its input is a first p-channel transistor switch 150 and a second p-channel compensation transistor switch 152. The transistors 150 and 152 are controlled by the timing control signals NAZ and AZ, respectively, which are generated by the control logic 70 of FIG. 3. As shown in FIG. 10, when the timing control signal SAM is at a logic zero, the auto-zero control signal AZ is a logic 1 such that the logical inverse signal NAZ is a logic zero thereby turning on the transistor 150 and shorting the output of the amplifier 124 to its input. This in turn drives the voltage at the input of the amplifier 124 to an arbitrary fixed voltage, the value of which is determined by the biasing circuit of the amplifier 124. During the auto-zero period, one, both or none of the input voltages, $CV_{IN}$ and $V_{TAP}(N)$ will be connected for sampling to the respective input capacitors depending upon the states of the status bits OPP and POL.

When the auto-zero signal AZ returns to logic zero (FIG. 10) marking the end of the auto-zero period, the transistor 150 is turned off removing the feedback loop between the output and the input of the amplifier 124. In addition, the basic timing control signal SAM rises to a logical one, marking the beginning of the comparison period. The particular input voltages ($CV_{IN}$ and/or $V_{TAP}(N)$) coupled to the input capacitors 126 and 128 in the auto-zero period are disconnected from the input capacitors during the comparison period, and the input voltages ($CV_{IN}$ and/or $V_{TAP}(N)$) not coupled during the autozero period are coupled to the input capacitors 126 and 128 during the compare period. The voltage at the input of the amplifier 124 will then be either negative or positive depending upon whether the absolute value of the voltage $CV_{IN}$ or the absolute value of $V_{TAP}(N)$ is the greater.

The operation of each comparator 80 will be further explained by the following example. If the reference voltage inputed at the $V_{RP}$ input of the converter 60 is positive and the desired polarity of the full scale input is also positive (the first example of the table of FIG. 7), a logic zero should be inputed into the OPP input of the control logic 70 (FIG. 3) to indicate that the reference voltage $V_{RP}$ and the full scale input have the same polarity. As indicated in the table of FIG. 7, where the reference voltage $V_{RP}$ is positive (status bit POL at a logic one state) and the OPP input is a logic zero, the timing control signal SAMIH for the input switches 132 and 134 of the comparator 80 is basically the timing control signal SAM. In addition, the timing control signal SAMRH for the reference input switches 136 and 138 is the logical inverse NSAM of the timing control signal SAM. Consequently, referring now to FIG. 6, during the auto-zero period (control signal SAM at state logic zero), the timing control signal SAMIH is also at a logic zero state such that the input switch 132 is open and the input switch 134 is closed, which couples the input capacitor 126 to analog ground (AG) during the auto-zero period. At the same time, the reference switch timing control signal SAMRH is at a logic one state such that the reference input switch 138 is open and the reference input switch 136 is closed, which couples the incremental reference voltage $V_{TAP}(N)$ to the second input capacitor 128.

As previously mentioned, the input of the amplifier 124 is at a predetermined fixed voltage level during the auto-zero period, which may be assumed to be ground (0 volts) for purposes of explanation. As a result, the incremental reference voltage $V_{TAP}(N)$ is applied across the input capacitor 128 while zero volts is applied across the input capacitor 126 during the auto-zero phase. In the subsequent comparison period (timing control signal SAM at a logic one state), the transistor switch 150 opens, removing the feedback loop from the output to the input of the amplifier 124. In addition, the logic states of the timing control signals SAMIH and SAMRH switch such that the input capacitor 128 is now coupled to analog ground and the input capacitor 126 is coupled to the input voltage $CV_{IN}$. The charge on the plates of the capacitors 126 and 128 which are coupled to the input of the amplifier 124 is fixed and this charge redistributes itself between these capacitor plates during the comparison period. The resulting charge distribution depends upon the relative magnitudes of the voltages $CV_{IN}$ and $V_{TAP}(N)$. The voltage at the input of the amplifier 124 will be positive if the absolute value of the input voltage CVIN is greater than the absolute value of the incremental reference voltage $V_{TAP}(N)$. Accordingly, the effective operation of each comparator 80 for these polarities of $V_{RP}$ and the full scale input, is to perform the arithmetic operation of subtracting the incremental reference voltage $V_{TAP}(N)$ from the input voltage $CV_{IN}$ as shown in the first example of the table of FIG. 7.

Alternatively, if the full scale input and the reference voltage at $V_{RP}$ are both negative, the order in which $CV_{IN}$ and $V_{TAP}(N)$ are applied to the input capacitors is switched in order to achieve a comparison of the absolute values of these inputs. Thus, as shown in the table of FIG. 7, where the full scale input of $V_{IN}$ and the reference voltage at VRP are the same polarity but are now both negative, the derivation of the input switch timing control signals SAMIH and SAMRH is switched. Accordingly, the reference input switch timing control signal SAMRH is now defined by the basic timing control signal SAM while the input switch timing control signal SAMIH is defined by the logical inverse timing control signal NSAM. As a result, the input capacitor 126 is coupled to the input signal $CV_{IN}$ during the auto-zero phase and is coupled to the ground during the comparison phase. Conversely, the second input capacitor 128 is coupled to analog ground during the auto-zero phase and is coupled to the incremental reference voltage $V_{TAP}(N)$ during the comparison phase. Despite the fact that the full scale input and the reference voltage at $V_{RP}$ are now negative rather than positive, the comparator 80 still outputs a logic one when the absolute value of the input signal $CV_{IN}$ is greater than the absolute value of the incremental reference voltage $V_{TAP}(N)$. For these polarities of $V_{RP}$ and the full scale input, the arithmetic operation performed by the comparators 80 is now $-(V_{IN} - V_{TAP}(N))$.

If the full scale input of $V_{IN}$ and the reference voltage at $V_{RP}$ are opposite in polarity (OPP logic state one) and the reference voltage at $V_{RP}$ is negative, both of the input timing control signals SAMIH and SAMRH are defined by the basic timing control signal SAM. Consequently, the input capacitors 126 and 128 are both connected to ground during the auto-zero period and are coupled to the input voltages $CV_{IN}$ and $V_{TAP}(N)$, respectively, during the comparison period. Finally, if the full scale input of $V_{IN}$ and the reference voltage $V_{RP}$ are again opposite in polarity (OPP logic state one) but the reference voltage at VRP is positive (POL logic state one) both of the input switch timing control signals SAMIH and SAMRH are defined by the logical inverse NSAM of the basic timing control signal SAM. Thus, the input capacitors 126 and 128 of the comparator 80 are coupled to the input voltage $CV_{IN}$ and $V_{TAP}(N)$, respectively, during the auto-zero phase and are coupled to ground during the comparison phase.

By changing the order in which the input voltages are coupled to the input capacitors, the comparators 80 of the comparator array 66 are able to compare the absolute values of the input voltages regardless of the relative polarities of the full scale input and the reference voltage. Consequently, the polarity of the full scale input may be chosen to be the same as or the opposite as the polarity of the reference voltage at $V_{RP}$ by applying the appropriate input to the program input OPP.

The amplifier 124 amplifies and inverts the voltage level at its input producing a logical one or logical zero state at its output depending upon the comparison of the voltages $CV_{IN}$ and $V_{TAP}(N)$. The output of the amplifier 124 is latched by an inverter latch stage 156 which is controlled by a timing control signal NLATH. As shown in FIG. 10, the control signal NLATH becomes active (logic zero) a predetermined time period after the timing control signal SAM changes state to a logic one to allow sufficient time for the voltages on the input capacitor to settle. After the output of the amplifier 124 is latched and inverted, the output of the latch 156 is transferred by a switch 158 to a second inverter/latch 159. The switch 158 is closed by the control signal NTRAH (FIG. 10).

The output of the latch stage 158 is connected to the input of a NOR gate 160. The other input of the NOR gate 160 is connected to the UP input of the comparator circuit 80. As previously mentioned, the UP input of each comparator circuit is connected to the NCMP output of the next comparator above in the comparator array (FIG. 4). The NCMP output is a logical one when the input voltage $CV_{IN}$ is greater than the incremental reference voltage associated with that particular comparator. The logic one state at the UP input of a comparator 80 disables the NOR gate 160 of that comparator, blocking the output of the latch 158 from the output B(N). However, the output of the latch 158 is coupled by an inverter 162 to the NCMP output of that converter. Accordingly, although the B(N) output of a particular comparator may be blocked, the NCMP output is not blocked and can disable the next comparator below in the array. Consequently, only the comparator with the largest associated incremental reference voltage which is less than the input voltage $CV_{IN}$ will provide an output to the encoder logic 68.

Figure 9:
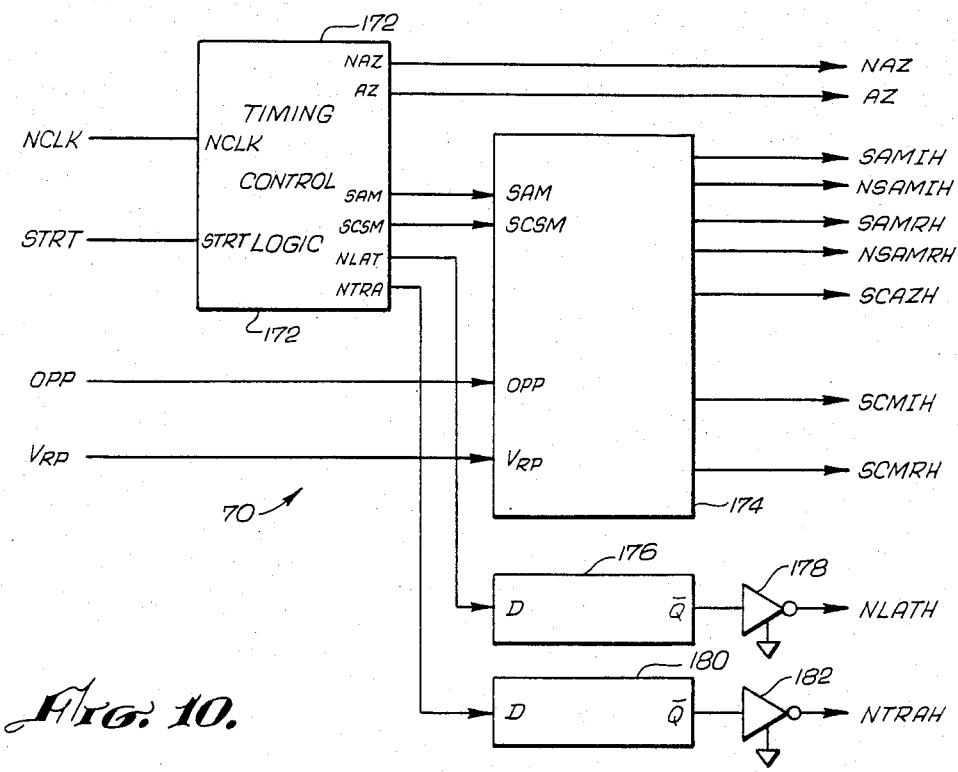
FIG. 9 is a schematic block diagram of the control logic of the converter circuit of FIG. 3.

Referring now to FIG. 9, the control logic 70 is shown to include a timing control logic circuit 172 which has a clock signal input NCLK and a second input STRT. A logic one inputed at the STRT input of the timing control logic 172 initiates the conversion process of the converter 60. Once the start signal STRT is received, the timing control logic 172 generates the auto-zero timing control signal AZ (and its logical inverse signal NAZ) from the clock signal NCLK after a predetermined delay as shown in FIG. 10. The timing control logic 172 also generates the basic sample timing control signal SAM which is outputed to a sampling control logic circuit 174. A second basic sample timing control signal SCSM for the switched capacitor amplifier 74 is also generated by the timing control logic 172 and is outputed to the sampling control logic 174. The switched capacitor amplifier 74 has a pair of switched input capacitors similar to the two input capacitors of each comparitor 80 of the comparator array 66.

The sampling control logic 174 has inputs for the program input signal OPP and the reference voltage VRP. The sampling control logic circuit 174 assigns either the basic sample timing control signal SAM or its logical inverse signal NSAM to the input switch timing control signals SAMIH and SAMRH for the comparator array 66, depending upon the logic state of the program input OPP and the polarity of the reference voltage $V_{RP}$ in accordance with the table of FIG. 7. Similarly, the sampling control logic 174 assigns the switched capacitor amplifier basic sample timing control signal SCSM or its logical inverse signal NSCSM to the switched capacitor amplifier input switch timing control signals SCMIH and SCMRH (to be described below) in accordance with the logic state of OPP and the polarity of $V_{RP}$. Finally, the sampling control logic 174 also generates an auto-zero timing control signal SCAZH for the switched capacitor amplifier 74 from the switched capacitor amplifier basic sample timing control signal SCSM. In the illustrated embodiment, the voltage range of these output signals of the sampling control logic 174 range from $-5$ volts to $+5$ volts as indicated by the letter designation "H" of each signal name.

A latch timing control signal NLAT is generated by the timing control logic 172 and is outputed to a D-type flip flop 176. The $\overline{Q}$ output of the flip flop 176 is amplified and inverted by a level shifter 178 to provide the latch timing control signal NLATH for the comparators 80 of the comparator array 66. A transfer timing control signal NTRA is also generated by the timing control logic 172. A flip flop 180 latches the signal NTRA and an amplifier 182 inverts and amplifies the $\overline{Q}$ output of the flip flop 180 to provide the transfer timing control signal NTRAH to the comparators of the comparator array.

Figure 11:
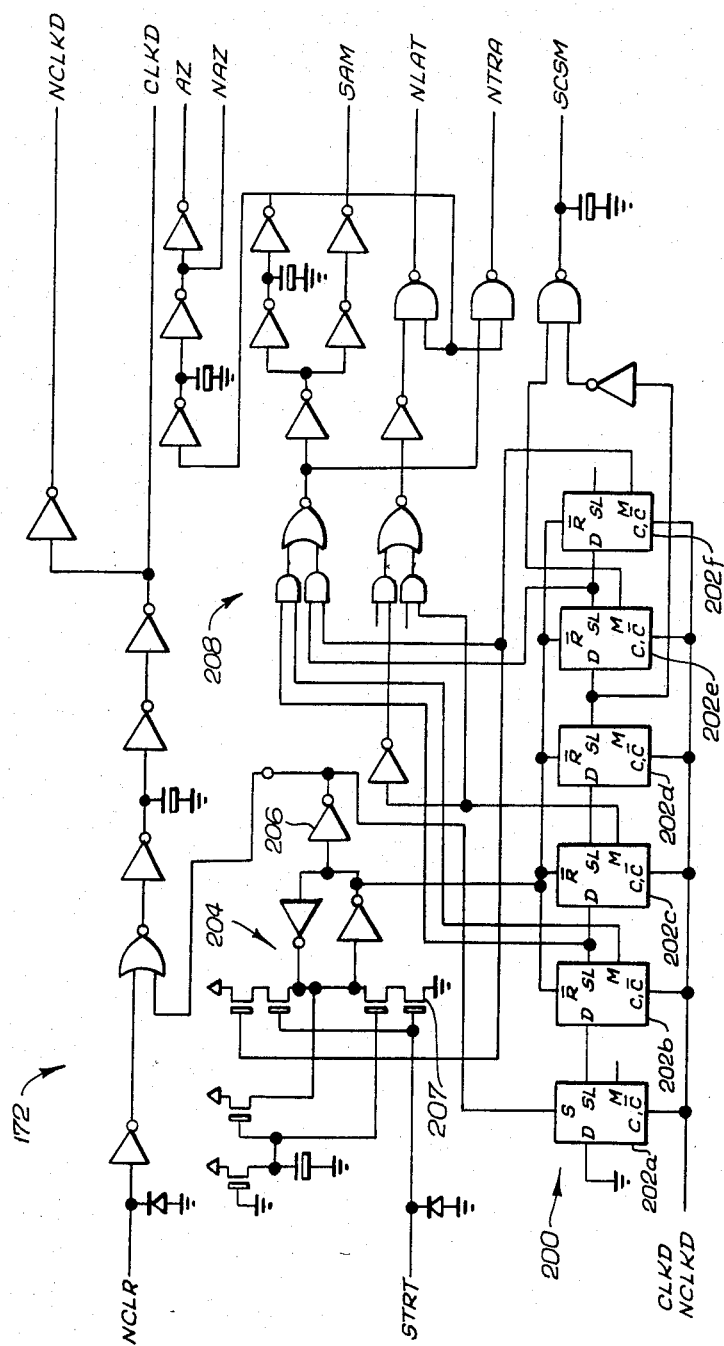
FIG. 11 is a schematic block diagram of the timing control logic of the control logic of FIG. 9.

FIG. 11 shows a more detailed schematic diagram of the timing control logic 172 of FIG. 9. The timing control logic 172 has a shift register 200 which includes a plurality of D-type flip flops 202a-202f. The output of a latch circuit 204 is initially set at a logic state zero to maintain the flip flops 202b-202f in the reset state. The output of the latch 204 is also inverted by an inverter 206, the output of which sets the first flip flop 202a of the shift register 200 to a logic one state. When the start pulse STRT is inputed by the timing control logic 172, a transistor 208 is turned on which changes the output of the latch 204 to a logic one, removing the reset signal from the flip flops 202b-202f. As a result, the logic one state of the first flip flop 202a will be shifted through the remaining flip flops 202b-202f, one flip flop at a time, on each successive clock pulse. The outputs of flip flops 202b-202f are decoded by the combinational logic circuit indicated generally at 208. The outputs of the combinational logic circuitry 208 provide the timing control signals AZ, NAZ, SAM, NLAT, NTRA and SCFM in the timed relation shown in FIG. 10.

The sampling control logic circuitry 174 is shown in greater detail in FIG. 12. As shown therein, the sampling control logic 174 includes a pair of switches 220 and 222 which couples either the basic sample timing signal SAM or its logical inverse NSAM to the reference input timing control signal output SAMRH, depending upon the polarity of the reference voltage $V_{RP}$. As shown in the table of FIG. 7, the reference input timing control signal SAMRH is defined as the logical inverse signal NSAM of the basic sample timing control signal SAM when the reference voltage $V_{RP}$ is positive, and is defined as the basic sample timing control signal SAM when $V_{RP}$ is negative.

The sampling control logic 174 further includes a pair of switches 224 and 226 which couple either the basic timing control signal SAM or its logical inverse signal NSAM to the input switch timing control signal output SAMIH depending upon the logic state of the program input OPP and the polarity of the reference voltage $V_{RP}$. The combinational logic circuitry indicated at 230 has inputs coupled to the OPP and $V_{RP}$ inputs, and controls the states of the switches 224 and 226 in dependence on the logic states of the inputs $V_{RP}$ and OPP. As shown in the table of FIG. 7, the input switch timing control signal SAMIH is assigned the basic timing control signal SAM in either of two conditions. The first condition is where the OPP input is logic state zero (i.e. the full scale input and the reference voltage have the same polarity) and the reference voltage $V_{RP}$ is positive. The second condition is where the reference voltage $V_{RP}$ is negative and the polarities of the reference voltage $V_{RP}$ and the full scale input are opposite (OPP logic state one). Alternatively, the table of FIG. 7 indicates that the input switch timing control signal SAMIH is assigned the logical inverse signal NSAM of the basic timing control signal SAM in either of the two remaining possible conditions.

A third pair of switches 232 and 234 couples either the switched capacitor amplifier basic sample timing control signal SCSM or its logical inverse signal NSCSM to the reference input timing control signal SCMRH of the switched capacitor amplifier 74, depending upon the logic state of the OPP input. The OPP program input is coupled to the input of an inverter 236 which has an output 238. The output 238 of the inverter 236 is coupled to the input of an inverter 240 which has an output 242. The output 238 of the inverter 236 is coupled (connection not shown) to the non-inverting control input of the switch 234 and the inverting control input of the switch 232. In addition, the output 242 of the inverter 240 is coupled (connection not shown) to the non-inverting control input of the switch 232 and the inverting control input of the switch 234. Consequently, the opening and closing of the switches 232 and 234 is controlled by the logic state of the program input OPP. Hence, whether the switched capacitor amplifier reference input timing control signal SCMRH is assigned the basic timing control signal SCSM or NSCSM depends upon the logic state of OPP as indicated in the table of FIG. 7.

The switched capacitor amplifier input timing control signal SCMIH does not depend on the logic state of the program input OPP but is instead assigned to the logic inverse signal NSCSM of the switched capacitor amplifier basic sample timing signal SCSM. Accordingly, in the illustrated embodiment, the overall switching order of the input capacitors of the switched capacitor amplifier 74 depends only on the logic state of the program input OPP, as will be more fully explained below. Finally, the sampling control logic 174 includes a plurality of D flip flops (indicated at 250) for latching the outputs of the switches and a plurality of inverting amplifiers 252 for converting the outputs of the flip flops to signals ranging from $-5$ volts to 5 volts.

Referring back to FIG. 3, upon completion of the first step of the analog to digital conversion in which the high byte (four most significant bits) appears at the BIT3-BIT0 outputs of the encoder logic 68, the incremental reference voltage $V_{TAP}(N)$ is outputed by the comparator array 66 to the switched capacitor amplifier 74. As previously mentioned, the voltage $V_{TAP}(N)$ is the equivalent analog voltage of the high byte output of the encoder logic 68. In the second step of the conversion process, the switched capacitor amplifier 74 subtracts the high byte equivalent voltage $V_{TAP}(N)$ from the analog input voltage $V_{IN}$ to produce a residual signal. This residual signal is multiplied by a factor of 16 to produce a product signal designated $V_{OUT}$. The product signal $V_{OUT}$ is coupled through the switch 76 to the input $CV_{IN}$ of the comparator array 66. There, the product signal is compared to the 15 incremental reference voltages by the comparator array 66 and the comparator array 66 activates one (or none) of the output lines B1-B15 in accordance with that comparison. The encoder logic 68 encodes the output of the comparator array 66 and outputs one of 16 binary numbers which represent the four least significant bits (the low byte) of the digital representation of the analog input signal $V_{IN}$. At that time, the low byte valid control signal NLBV is activated.

Figure 14:
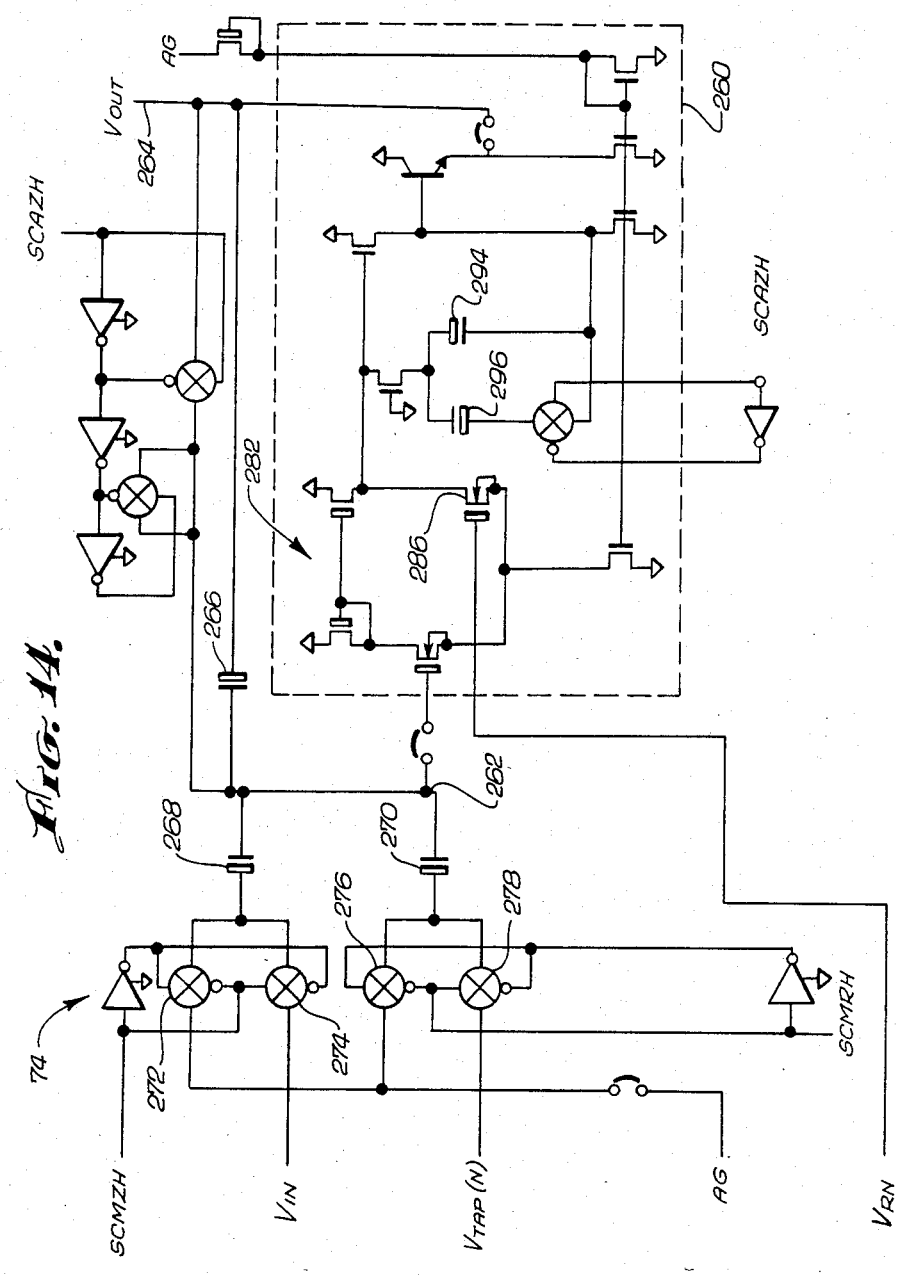
FIG. 14 is a schematic diagram of the switched capacitor amplifier of the converter circuit of FIG. 3.

The switched capacitor amplifier 74 is shown in greater detail in FIG. 14. The switched capacitor amplifier 74 includes an amplifier 260 which has an input 262 and an output 264 designated $V_{OUT}$. The output 264 is coupled to the input 262 by a feedback capacitor 266. Also coupled to the input 262 of the amplifier 260 is a pair of input capacitors 268 and 270. Similar to the comparators 80 of the comparator array 66, the switched capacitor amplifier 74 has a pair of switches 272 and 274 which couple the first input capacitor 268 to either the analog input signal $V_{IN}$ or analog ground (AG), respectively, depending upon the logic state of the timing control signal SCMIH. A second pair of switches 276 and 278 couple the second input capacitor 270 to either the high byte equivalent voltage $V_{TAP}(N)$ or the analog ground (AG), respectively, depending upon the logic state of the timing control signal SCMRH. The timing control signals SCMIH and SCMRH open and close the switches 272, 274, 276 and 278 in sequence to produce a residual signal at the input 262. The residual signal is equal to the analog input signal $V_{IN}$ less the magnitude of the high byte equivalent voltage $V_{TAP}(N)$.

During the auto-zero period of the second basic sampling timing signal SCSM (FIG. 8), the output 264 of the amplifier 260 is shorted to its input 262 by a switch 280, driving the input 262 to a fixed predetermined voltage. At the start of the comparison period, the auto-zero timing control signal SCAZH opens the switch 280 such that the feedback path from the output 264 to the input 262 is provided only by the feedback capacitor 266. In this configuration, the amplifier 260 amplifies the residual voltage at the input 262 by a predetermined factor. In the illustrated embodiment, the predetermined factor is computed as $2_n$ where n is the number of bit positions in the high byte computed during the first step of the overall conversion.

As shown in the table of FIG. 7, the reference switch timing control signal SCMRH is assigned either the second basic sample timing control signal SCSM or its logical inverse signal NSCSM depending upon the logic state of the program input OPP. Thus, whether the high byte equivalent voltage $V_{TAP}(N)$ is coupled to the second input capacitor 270 during the auto-zero period and analog ground is coupled to the second input capacitor 270 during the compare period, or the reverse occurs, depends upon whether the full scale input has the same or opposite polarity as the reference voltage $V_{RP}$. The input switch timing control signal SCMIH is always assigned the logical inverse signal NSCSM of the second basic timing control signal SCSM independently of the program input OPP. Thus, the analog input voltage $V_{IN}$ is coupled to the first input capacitor 268 in the auto-zero period and the input capacitor 268 is coupled to ground in the comparison period, regardless of the logic state of the program input OPP, in the illustrated embodiment.

By changing the sequence in which the high byte equivalent voltage $V_{TAP}(N)$ is coupled to the second input capacitor 270, the switched capacitor amplifier 74 is able to subtract the magnitude of the high byte equivalent voltage from the input voltage $V_{IN}$ whether or not the reference voltage $V_{RP}$ and the full scale input have the same polarity. The table of FIG. 7 sets out the effective arithmetic operation of the switched capacitor amplifies 74 based on the relative polarities of $V_{RP}$ and the full scale input. The product signal $V_{OUT}$ has the same polarity as the analog input signal $V_{IN}$ so that the comparator array 66 operates in the same manner with respect to the OPP program input to produce the low byte as in the first step in which the high byte was produced.

The amplifier 260 includes a first input stage 282 which is a CMOS differential amplifier in the illustrated embodiment. The control input of one n-channel input transistor 284 is coupled to the input 262 of the amplifier 260. The control input of the other n-channel input transistor 286 of the first stage 282 is connected to the second reference voltage input $V_{RN}$. The output of the input stage 282 is coupled to a second stage 290, the output of which is coupled to an emitter follower stage 292. The amplifier 260 has a first compensation capacitor 294, and a second compensation capacitor 296 which is coupled in parallel with the first capacitor 294 only during the auto-zero period of the basic sample timing control signal SCSM.

It will of course, be understood that modifications of the present invention, in its various aspects, will be apparent to those skilled in the art, some being apparent only after study and others being merely matters of routine electronic design. For example, the program input may be defined in terms of the polarity of the low scale input rather than the full scale input. In addition, converter circuitry other than that shown herein may be used to compute each byte of the digital representation. Other embodiments are also possible with their specific designs dependent upon the particular application. As such, the scope of the invention should not be limited by the particular embodiment herein described, but should be defined only by the appended claims and equivalents thereof. Various features of the invention are set forth in the following claims.

I claim:

1. An analog to digital converter for converting an analog input signal to a digital representation by comparison with a desired reference voltage, said converter comprising:

a scale input for receiving a scale reference signal;

a program input for receiving a program input signal having a first logic value if said scale reference signal has the same voltage polarity as said desired reference voltage and having the opposite logic value if said scale reference signal has the opposite voltage polarity of said desired reference voltage;

incremental reference means coupled to said scale input for providing a plurality of incremental reference voltages;

a plurality of comparator means each for comparing said analog input signal to a respective incremental reference voltage, each comparator means including an amplifier, a pair of input capacitors coupled to said amplifier and switch means for selectively coupling one of said input capacitors either to said analog input signal or to circuit common and for selectively coupling the other input capacitor either to its respective incremental reference voltage or to circuit common; and control means coupled to said scale input, said program input and said plurality of comparator means, said control means for operating said plurality of comparator means in an auto-zero period and a comparison period, said control means controlling said switch means in a manner adapted to:

(1) apply said analog input signal to said one input capacitor in said auto-zero period and the respective incremental reference voltage to said other input capacitor in said comparison period if said scale reference signal and said desired reference voltage have the same polarity and said desired reference voltage has a first polarity;

(2) apply the respective incremental reference voltage to said other input capacitor in said auto-zero period and said analog input signal to said one input capacitor in said comparison period if said scale reference signal and said desired reference voltage have the same polarity and the desired reference voltage has a second polarity opposite to said first polarity;

(3) apply said analog input signal and the respective incremental reference voltage to said one and said other input capacitors, respectively, during said comparison period if said scale reference signal and said desired reference voltage are of opposite polarity and said desired reference voltage has said second polarity; and (4) apply said analog input signal and the respective incremental reference voltage to said one and said other input capacitors, respectively, during said auto-zero period if said scale reference signal and said desired reference voltage are of opposite polarity and said desired reference voltage has said first polarity.

2. The analog to digital converter of claim 1 further comprising encoder means coupled to said plurality of comparator means for providing said digital representation in response to an output signal from said plurality of comparator means.

3. The analog to digital converter of claim 1 wherein said digital representation has a plurality of high order bits and a plurality of low order bits, said converter providing said high order bits in a first step and said low order bits in a second step, said converter further comprising:

voltage means for providing an equivalent analog voltage of said high order bits; and a switched capacitor amplifier means having a pair of input capacitors, for subtracting said equivalent analog voltage from the magnitude of said analog input signal to produce a residual signal, and for multiplying said residual signal by a predetermined factor to produce a product signal;

said control means further adapted to couple said product signal to said plurality of comparator means during said second step to produce said low order bits, said control means further adapted to apply said analog input signal to the first input capacitor of said amplifier means and said equivalent analog voltage to the second capacitor of said amplifier means in a sequence determined by the relative polarities of said scale reference signal and said desired reference voltage.

* * * * *